United States Patent
Do et al.

(10) Patent No.: US 7,786,008 B2
(45) Date of Patent: Aug. 31, 2010

(54) INTEGRATED CIRCUIT PACKAGING SYSTEM HAVING THROUGH SILICON VIAS WITH PARTIAL DEPTH METAL FILL REGIONS AND METHOD OF MANUFACTURE THEREOF

(75) Inventors: Byung Tai Do, Singapore (SG); Seng Guan Chow, Singapore (SG); Seung Uk Yoon, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/334,347

(22) Filed: Dec. 12, 2008

(65) Prior Publication Data

US 2010/0148336 A1 Jun. 17, 2010

(51) Int. Cl.
*H01L 21/44* (2006.01)
*H01L 23/04* (2006.01)

(52) U.S. Cl. ........................ 438/667; 438/672; 438/675; 257/698; 257/774

(58) Field of Classification Search .................. 438/637, 438/638, 640, 666, 667, 672, 675; 257/698, 257/773, 774, 775
See application file for complete search history.

(56) References Cited

U.S. PATENT DOCUMENTS

| | | | |
|---|---|---|---|
| 6,352,923 B1 * | 3/2002 | Hsuan et al. | 438/667 |
| 6,873,054 B2 | 3/2005 | Miyazawa et al. | |
| 6,908,856 B2 * | 6/2005 | Beyne et al. | 438/667 |
| 6,998,344 B2 | 2/2006 | Akram et al. | |
| 7,132,731 B2 * | 11/2006 | Wood et al. | 257/621 |
| 7,282,431 B2 | 10/2007 | Kang et al. | |
| 7,354,798 B2 | 4/2008 | Pogge et al. | |
| 7,419,906 B2 * | 9/2008 | Kato | 438/668 |
| 7,498,260 B2 * | 3/2009 | Hiatt | 438/667 |
| 7,528,068 B2 * | 5/2009 | Soejima et al. | 438/667 |
| 7,602,047 B2 * | 10/2009 | Kwon et al. | 257/621 |
| 2006/0043535 A1 * | 3/2006 | Hiatt | 257/621 |
| 2007/0284729 A1 | 12/2007 | Kwon et al. | |

* cited by examiner

*Primary Examiner*—Kevin M Picardat
(74) *Attorney, Agent, or Firm*—Mikio Ishimaru

(57) ABSTRACT

A method of manufacture of an integrated circuit packaging system includes: providing a silicon substrate having a circuitry layer; creating a partial via through the circuitry layer; filling the partial via with a plug having a bottom surface; creating a recess that is angled outward and exposes the bottom surface of the plug; and coating the recess with a recess-insulation-layer while leaving the bottom surface of the plug exposed.

20 Claims, 10 Drawing Sheets

INTEGRATED CIRCUIT PACKAGING SYSTEM HAVING THROUGH SILICON VIAS WITH PARTIAL DEPTH METAL FILL REGIONS AND METHOD OF MANUFACTURE THEREOF

TECHNICAL FIELD

The present invention relates generally to an integrated circuit packaging system and more particularly to a system for utilizing through silicon vias with partial depth metal fill regions in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a silicon substrate having a circuitry layer; creating a partial via through the circuitry layer; filling the partial via with a plug having a bottom surface; creating a recess that is angled outward and exposes the bottom surface of the plug; and coating the recess with a recess-insulation-layer while leaving the bottom surface of the plug exposed.

The present invention provides an integrated circuit packaging system including: a silicon substrate having a circuitry layer; a partial via created through the circuitry layer; a plug having a bottom surface that fills the partial via; a recess that is angled outward and exposes the bottom surface of the plug; and a recess-insulation-layer that coats the recess while leaving the bottom surface of the plug exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
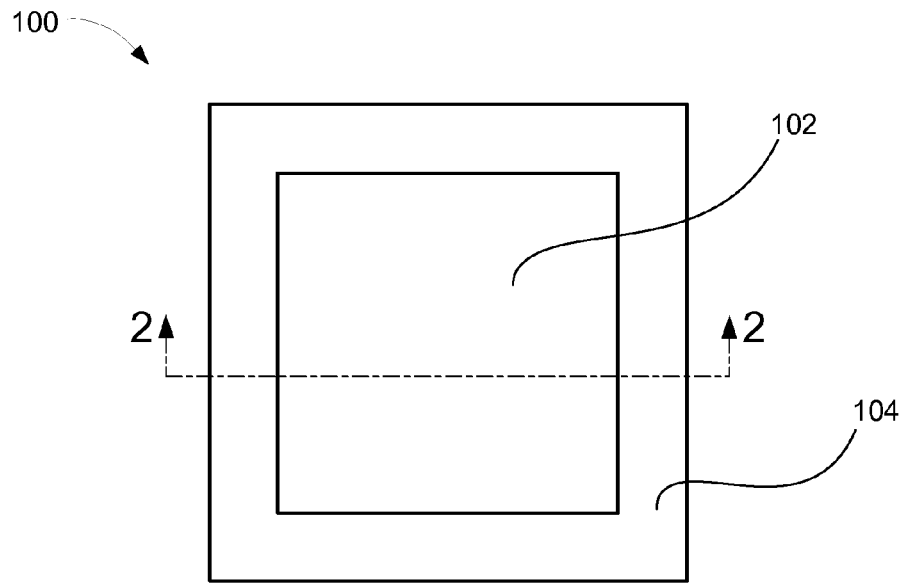
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the through-silicon-via-die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 is shown having an external integrated circuit package 102 mounted above an encapsulation 104.

Figure 2:
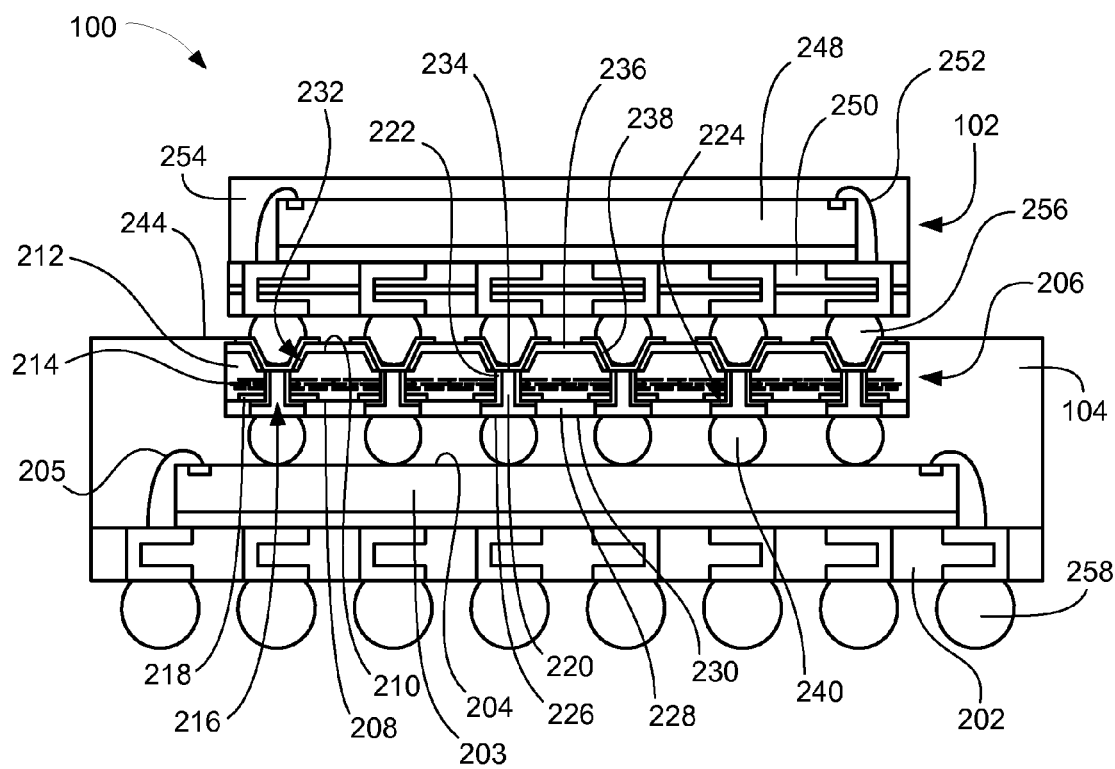
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

Mounted above the substrate 202 is an integrated circuit die such as a wire-bonded die 203 with an active side 204. The active side 204 is connected to the substrate 202 with interconnects such as bond wires 205.

Mounted above the wire-bonded die 203 is a through-silicon-via-die 206. The through-silicon-via-die 206 has a face side 208 and a back side 210 on a silicon substrate 212. The through-silicon-via-die 206 is mounted so that the face side 208 is facing the substrate 202.

Near the face side 208 is a circuitry layer 214. Partial vias 216 are etched or drilled across and through the circuitry layer 214 on the face side 208. The partial vias 216 are also etched through contact pads 218 on the face side 208.

The partial vias 216 are filled with plugs such as metal plugs 220 and lined with via-insulation-layers 222. The metal plugs 220 fill the partial vias 216 and create overhangs 224 around the partial vias 216. The metal plugs 220 extend downward from the overhangs 224 and end with planar surfaces 226. Surrounding the metal plugs 220, while leaving the planar surfaces 226 exposed, is a face-side-dielectric-layer 228 with a planar surface 230.

The planar surface 230 of the face-side-dielectric-layer 228 is co-planar to the planar surfaces 226 of the metal plugs 220. On the back side 210 recesses 232 are formed into the silicon substrate 212. The recesses 232 expose bottom surfaces 234 of the metal plugs 220. The recesses 232 are angled outward to provide a larger area near the back side 210 of the silicon substrate 212 than the metal plugs 220.

It has been discovered that the angle of the recesses 232 increases the through-silicon-via-die's strength because more of the silicon substrate 212 is preserved. The recesses 232 and the back side 210 are coated with a recess-insulation-layer 236 such as silicon dioxide or silicon nitride while leaving the bottom surfaces 234 of the metal plugs 220 exposed. Plated inside the recesses 232 are plated contacts 238. The plated contacts 238 contact the bottom surfaces 234 of the metal plugs 220.

The through-silicon-via-die 206 is connected to the active side 204 of the wire-bonded die 203 with interconnects such as solder balls 240. The solder balls 240 contact the metal plugs 220.

The encapsulation 104 encapsulates the wire-bonded die 203 and partially encapsulates the through-silicon-via-die 206. The encapsulation 104 has a top surface 244 from which the plated contacts 238 and the recess-insulation-layer 236 is exposed.

Mounted above the through-silicon-via-die 206 is the external integrated circuit package 102. The external integrated circuit package 102 has an external package integrated circuit die 248 connected to an external package substrate 250 with external package bond wires 252 and encapsulated by an external package encapsulation 254.

The external integrated circuit package 102 is connected to the plated contacts 238 with solder balls 256. Mounted below the substrate 202 are interconnects 258 such as solder balls.

Figure 3:
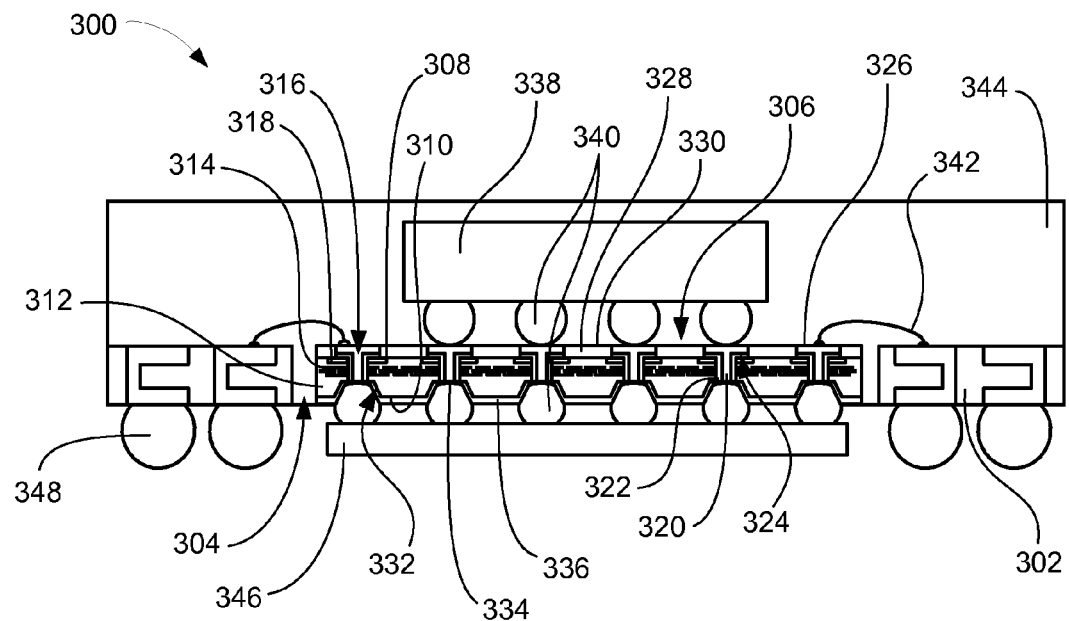
FIG. 3 is a cross-sectional view of an integrated circuit packaging system in a further embodiment of the present invention.

Referring now to FIG. 3, therein is shown a cross-sectional view of an integrated circuit packaging system 300 in a further embodiment of the present invention. The integrated circuit packaging system 300 is shown having a substrate 302 such as a laminated plastic or ceramic substrate.

The substrate 302 has a substrate cavity 304. Mounted inside the substrate cavity 304 is a through-silicon-via-die 306. The through-silicon-via-die 306 has a face side 308 and a back side 310 on a silicon substrate 312. Near the face side 308 is a circuitry layer 314. Partial vias 316 are etched or drilled across and through the circuitry layer 314 on the face side 308. The partial vias 316 are also etched through contact pads 318 on the face side 308.

The partial vias 316 are filled with metal plugs 320 and lined with via-insulation-layers 322. The metal plugs 320 fill the partial vias 316 and create overhangs 324 around the partial vias 316. The metal plugs 320 extend upward from the overhangs 324 and end with planar surfaces 326. Surrounding the metal plugs 320, while leaving the planar surfaces 326 exposed, is a face-side-dielectric-layer 328 with a planar surface 330.

The planar surface 330 of the face-side-dielectric-layer 328 is co-planar to the planar surfaces 326 of the metal plugs 320. On the back side 310 recesses 332 are formed into the silicon substrate 312. The recesses 332 exposes bottom surfaces 334 of the metal plugs 320. The recesses 332 are angled outward to provide a larger area near the back side 310 of the silicon substrate 312 than the metal plugs 320.

It has been discovered that the angle of the recesses 332 increases the through-silicon-via-die's strength because more of the silicon substrate 312 is preserved. The recesses 332 and the back side 310 are coated with a recess-insulation-layer 336 such as silicon dioxide or silicon nitride.

Mounted above the through-silicon-via-die 306 is an internal integrated circuit package 338 such as a flip chip. The internal integrated circuit package 338 is connected to the planar surfaces 326 of the through-silicon-via-die 306 with interconnects such as solder balls 340.

The through-silicon-via-die 306 is connected to the substrate 302 with bond wires 342. The internal integrated circuit package 338 is encapsulated with an encapsulation 344. The encapsulation 344 partially encapsulates the through-silicon-via-die 306 leaving the back side 310 and the bottom surfaces 334 of the metal plugs 320 exposed from the encapsulation 344.

Mounted below the back side 310 of the through-silicon-via-die 306 is an external integrated circuit package 346. The external integrated circuit package 346 is connected to the bottom surfaces 334 of the metal plugs 320 with the solder balls 340. Mounted below the substrate 302 are external interconnects 348 such as solder balls.

Figure 4:
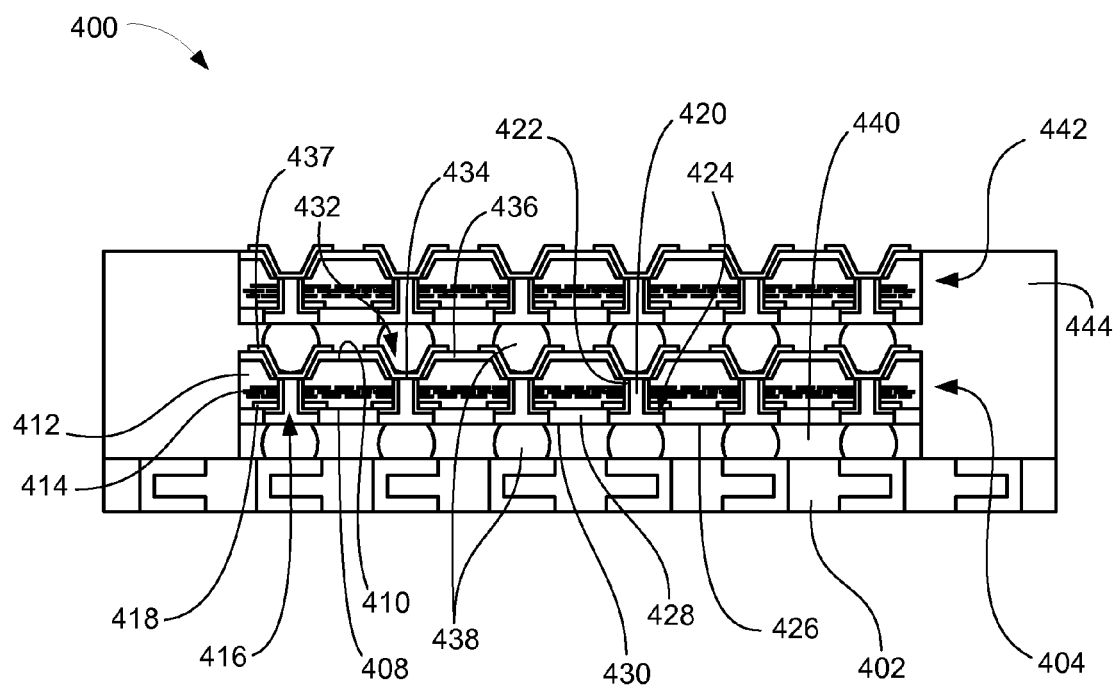
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate.

Mounted above the substrate is a first-through-silicon-via-die 404. The first-through-silicon-via-die 404 has a face side 408 and a back side 410 on a silicon substrate 412. The first-through-silicon-via-die 404 is mounted so that the face side 408 is facing the substrate 402.

Near the face side 408 is a circuitry layer 414. Partial vias 416 are etched or drilled across and through the circuitry layer 414 on the face side 408. The partial vias 416 are also etched through contact pads 418 on the face side 408.

The partial vias 416 are filled with metal plugs 420 and lined with via-insulation-layers 422. The metal plugs 420 fill the partial vias 416 and create overhangs 424 around the partial vias 416. The metal plugs 420 extend downward from the overhangs 424 and end with planar surfaces 426. Surrounding the metal plugs 420, while leaving the planar surfaces 426 exposed, is a face-side-dielectric-layer 428 with a planar surface 430.

The planar surface 430 of the face-side-dielectric-layer 428 is co-planar to the planar surfaces 426 of the metal plugs 420. On the back side 410 recesses 432 are formed into the silicon substrate 412. The recesses 432 exposes bottom surfaces 434 of the metal plugs 420. The recesses 432 are angled outward to provide a larger area near the back side 410 of the silicon substrate 412 than the metal plugs 420.

It has been discovered that the angle of the recesses 432 increases the through-silicon-via-die's strength because more of the silicon substrate 412 is preserved. The recesses 432 and the back side 410 are coated with a recess-insulation-layer 436 such as silicon dioxide or silicon nitride. Plated inside the recesses 432 are plated contacts 437. The plated contacts 437 contact the bottom surfaces 434 of the metal plugs 420.

The first-through-silicon-via-die 404 is mounted to the substrate 402 with interconnects such as solder balls 438. Between first-through-silicon-via-die 404 and the substrate 402 is an under-fill 440 which surrounds the solder balls 438 and adds rigidity to the solder balls 438.

Mounted above the first-through-silicon-via-die 404 is a second-through-silicon-via-die 442. The second-through-silicon-via-die 442 is connected to the first-through-silicon-via-die 404 with the solder balls 438. The solder balls 438 connecting the first-through-silicon-via-die 404 with the second-through-silicon-via-die 442 contact the plated contacts 437 connected to the metal plugs 420 of the first-through-silicon-via-die 404.

The second-through-silicon-via-die 442 has the partial vias 416 and the partial vias 416 on the second-through-silicon-via-die 442 are filled with the metal plugs 420. The second-through-silicon-via-die 442 also has the recesses 432 wherein the recess-insulation-layer 436 and the plated contacts 437 are also formed. The second-through-silicon-via-die 442 is mounted so that the partial vias 416 of the second-through-silicon-via-die 442 are facing the first-through-silicon-via-die 404.

The first-through-silicon-via-die 404 and the second-through silicon via 442 are encapsulated by an encapsulation 444. The encapsulation 444 partially encapsulates the second-through-silicon-via-die 442 leaving the recesses 432 and the contact pads 437 exposed from the encapsulation 444. Other packages may be mounted external to the encapsulation 444 and connected to the second-through-silicon-via-die 442 by the contact pads 437.

Figure 5:
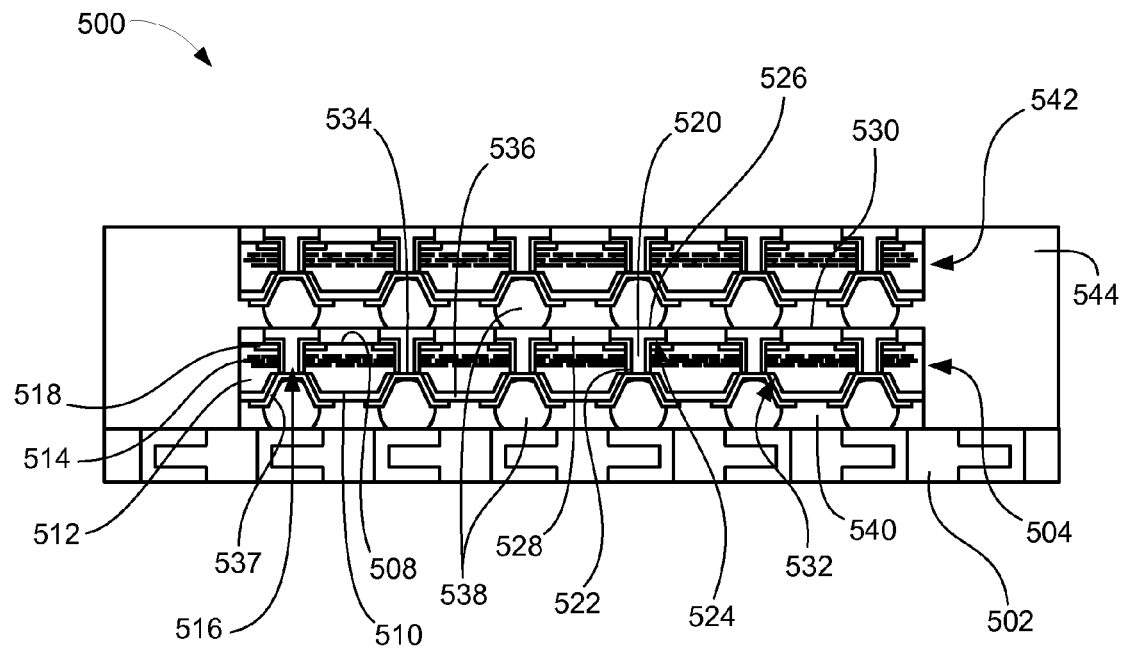
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a laminated plastic or ceramic substrate.

Mounted the substrate is a first-through-silicon-via-die 504. The first-through-silicon-via-die 504 has a face side 508 and a back side 510 on a silicon substrate 512. The first-through-silicon-via-die 504 is mounted so that the back side 510 is facing the substrate 502.

Near the face side 508 is a circuitry layer 514. Partial vias 516 are etched or drilled across and through the circuitry layer 514 on the face side 508. The partial vias 516 are also etched through contact pads 518 on the face side 508.

The partial vias 516 are filled with metal plugs 520 and lined with via-insulation-layers 522. The metal plugs 520 fill the partial vias 516 and create overhangs 524 around the partial vias 516. The metal plugs 520 extend upward from the overhangs 524 and end with planar surfaces 526. Surrounding the metal plugs 520, while leaving the planar surfaces 526 exposed, is a face-side-dielectric-layer 528 with a planar surface 530.

The planar surface 530 of the face-side-dielectric-layer 528 is co-planar to the planar surfaces 526 of the metal plugs 520. On the back side 510 recesses 532 are formed into the silicon substrate 512. The recesses 532 exposes bottom surfaces 534 of the metal plugs 520. The recesses 532 are angled outward to provide a larger area near the back side 510 of the silicon substrate 512 than the metal plugs 520.

It has been discovered that the angle of the recesses 532 increase the first-through-silicon-via-die's strength because more of the silicon substrate 512 is preserved. The recesses 532 and the back side 510 are coated with a recess-insulation-layer 536 such as silicon dioxide or silicon nitride. Plated inside the recesses 532 are plated contacts 537. The plated contacts 537 contact the bottom surfaces 534 of the metal plugs 520.

The first-through-silicon-via-die 504 is mounted to the substrate 502 with interconnects such as solder balls 538. Between first-through-silicon-via-die 504 and the substrate 502 is an under-fill 540 which surrounds the solder balls 538 and adds rigidity to the solder balls 538.

Mounted above the first-through-silicon-via-die 504 is a second-through-silicon-via-die 542. The second-through-silicon-via-die 542 is connected to the first-through-silicon-via-die 504 with the solder balls 538. The solder balls 538 connecting the first-through-silicon-via-die 504 with the second-through-silicon-via-die 542 contact the metal plugs 520 of the first-through-silicon-via-die 504.

The second-through-silicon-via-die 542 has the partial vias 516 and the partial vias 516 on the second-through-silicon-via-die 542 are filled with the metal plugs 520. The second-through-silicon-via-die 542 also has the recesses 532 wherein the recess-insulation-layer 536 and the plated contacts 537 are also formed. The second-through-silicon-via-die 542 is mounted so that the recesses 532 of the second-through-silicon-via-die 542 are facing the first-through-silicon-via-die 504.

The first-through-silicon-via-die 504 and the second-through silicon via 542 are encapsulated by an encapsulation 544. The encapsulation 544 partially encapsulates the second-through-silicon-via-die 542 leaving the metal plugs 520 exposed from the encapsulation 544. Other packages may be mounted external to the encapsulation 544 and connected to the second-through-silicon-via-die 542 by the metal plugs 520.

Figure 6:
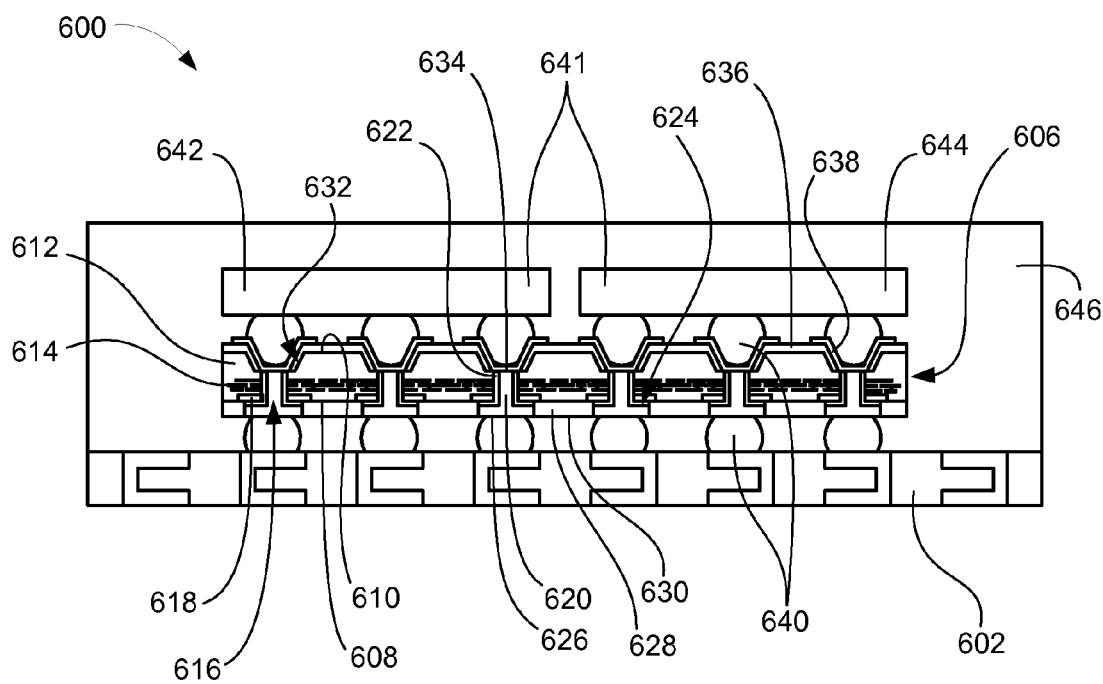
FIG. 6 is a cross-sectional view of an integrated circuit packaging system in a further embodiment of the present invention.

Referring now to FIG. 6, therein is shown a cross-sectional view of an integrated circuit packaging system 600 in a further embodiment of the present invention. The integrated circuit packaging system 600 is shown having a substrate 602 such as a laminated plastic or ceramic substrate.

Mounted above the substrate 602 is a through-silicon-via-die 606. The through-silicon-via-die 606 has a face side 608 and a back side 610 on a silicon substrate 612. The through-silicon-via-die 606 is mounted so that the face side 608 is facing the substrate 602.

Near the face side 608 is a circuitry layer 614. Partial vias 616 are etched or drilled across and through the circuitry layer 614 on the face side 608. The partial vias 616 are also etched through contact pads 618 on the face side 608.

The partial vias 616 are filled with metal plugs 620 and lined with via-insulation-layers 622. The metal plugs 620 fill the partial vias 616 and create overhangs 624 around the partial vias 616. The metal plugs 620 extend downward from the overhangs 624 and end with planar surfaces 626. Surrounding the metal plugs 620, while leaving the planar surfaces 626 exposed, is a face-side-dielectric-layer 628 with a planar surface 630.

The planar surface 630 of the face-side-dielectric-layer 628 is co-planar to the planar surfaces 626 of the metal plugs 620. On the back side 610 recesses 632 are formed into the silicon substrate 612. The recesses 632 exposes bottom surfaces 634 of the metal plugs 620. The recesses 632 are angled outward to provide a larger area near the back side 610 of the silicon substrate 612 than the metal plugs 620.

It has been discovered that the angle of the recesses 632 increases the through-silicon-via-die's strength because more of the silicon substrate 612 is preserved. The recesses 632 and the back side 610 are coated with a recess-insulation-layer 636 such as silicon dioxide or silicon nitride. Plated inside the recesses 632 are plated contacts 638. The plated contacts 638 contact the bottom surfaces 634 of the metal plugs 620.

The through-silicon-via-die 606 is connected to the substrate 602 with interconnects such as solder balls 640. The solder balls 640 contact the metal plugs 620. Mounted above the through-silicon-via-die 606 are integrated circuit structures 641 such as a first internal die 642 and a second internal die 644.

The first internal die 642 and the second internal die 644 may be flip chips and are connected to the through-silicon-via-die 606 with the solder balls 640. The solder balls 640 connecting the first internal die 642 and the second internal die 644 to the through-silicon-via-die 606 connect to the plated contacts 638.

An encapsulation 646 encapsulates the through-silicon-via-die 606, the first internal die 642, and the second internal die 644. The encapsulation 646 protects sensitive components from moisture, dust and other contamination.

Figure 7:
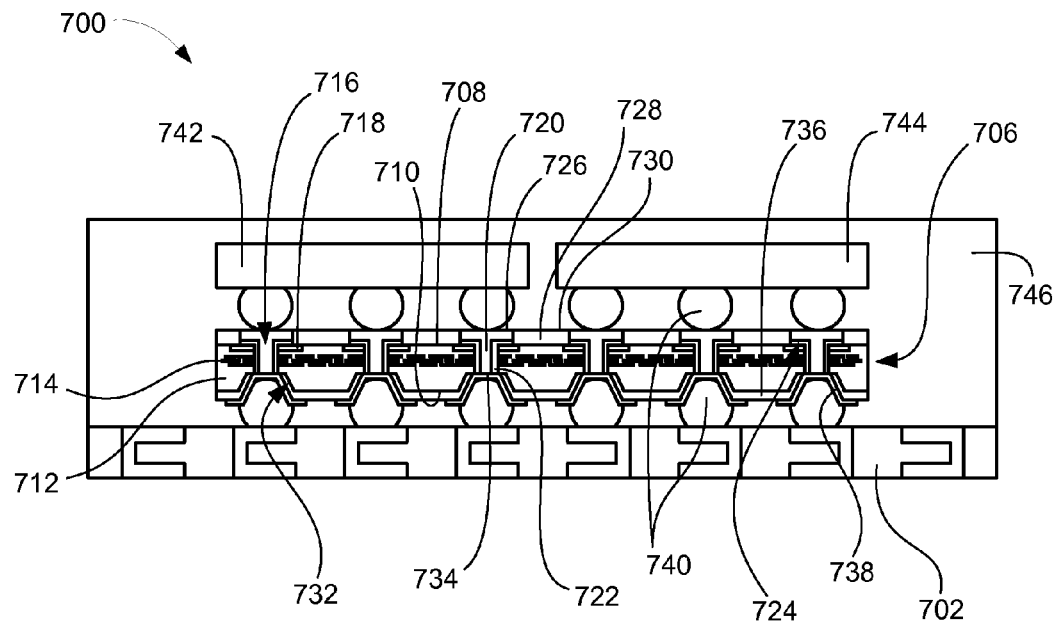
FIG. 7 is a cross-sectional view of an integrated circuit packaging system in a further embodiment of the present invention.

Referring now to FIG. 7, therein is shown a cross-sectional view of an integrated circuit packaging system 700 in a further embodiment of the present invention. The integrated circuit packaging system 700 is shown having a substrate 702 such as a laminated plastic or ceramic substrate.

Mounted above the substrate 702 is a through-silicon-via-die 706. The through-silicon-via-die 706 has a face side 708 and a back side 710 on a silicon substrate 712. The through-silicon-via-die 706 is mounted so that the back side 710 is facing the substrate 702.

Near the face side 708 is a circuitry layer 714. Partial vias 716 are etched or drilled across and through the circuitry layer 714 on the face side 708. The partial vias 716 are also etched through contact pads 718 on the face side 708.

The partial vias 716 are filled with metal plugs 720 and lined with via-insulation-layers 722. The metal plugs 720 fill the partial vias 716 and create overhangs 724 around the partial vias 716. The metal plugs 720 extend upward from the overhangs 724 and end with planar surfaces 726. Surrounding the metal plugs 720, while leaving the planar surfaces 726 exposed, is a face-side-dielectric-layer 728 with a planar surface 730.

The planar surface 730 of the face-side-dielectric-layer 728 is co-planar to the planar surfaces 726 of the metal plugs 720. On the back side 710 recesses 732 are formed into the silicon substrate 712. The recesses 732 exposes bottom surfaces 734 of the metal plugs 720. The recesses 732 are angled outward to provide a larger area near the back side 710 of the silicon substrate 712 than the metal plugs 720.

It has been discovered that the angle of the recesses 732 increases the through-silicon-via-die's strength because more of the silicon substrate 712 is preserved. The recesses 732 and the back side 710 are coated with a recess-insulation-layer 736 such as silicon dioxide or silicon nitride. Plated inside the recesses 732 are plated contacts 738. The plated contacts 738 contact the bottom surfaces 734 of the metal plugs 720.

The through-silicon-via-die 706 is connected to the substrate 702 with interconnects such as solder balls 740. The solder balls 740 contact the plated contacts 738 in the recesses 732 of the back side 710. Mounted above the through-silicon-via-die 706 are multiple internal dies such as a first internal die 742 and a second internal die 744.

The first internal die 742 and the second internal die 744 may be flip chips and are connected to the through-silicon-via-die 706 with the solder balls 740. The solder balls 740 connecting the first internal die 742 and the second internal die 744 to the through-silicon-via-die 706 connect to the plated contacts 738.

An encapsulation 746 encapsulates the through-silicon-via-die 706, the first internal die 742, and the second internal die 744. The encapsulation 746 protects sensitive components from moisture, dust and other contamination.

Figure 8:
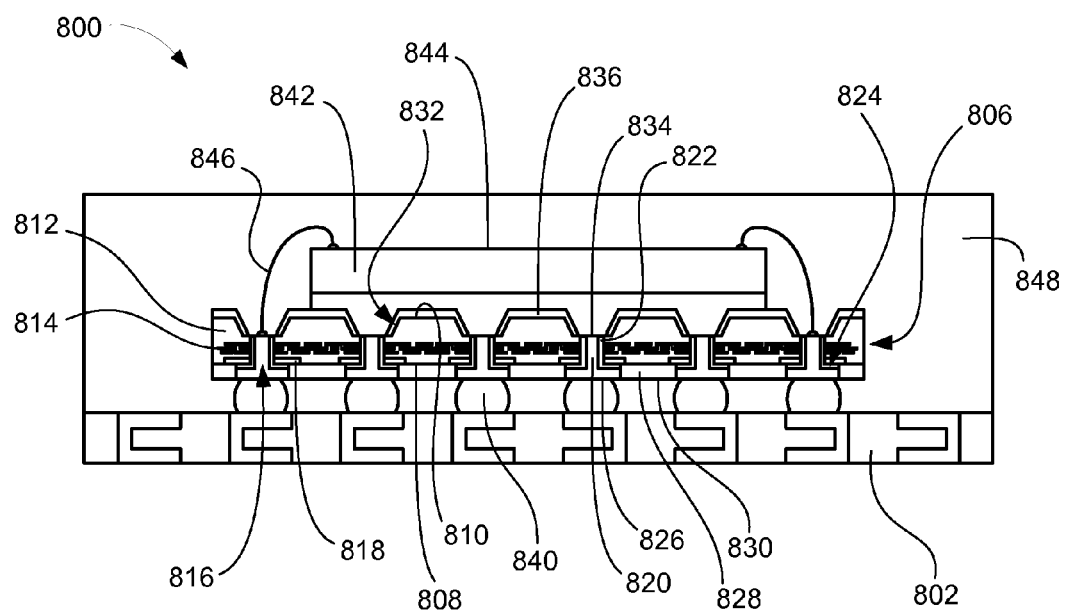
FIG. 8 is a cross-sectional view of an integrated circuit packaging system in a further embodiment of the present invention.

Referring now to FIG. 8, therein is shown a cross-sectional view of an integrated circuit packaging system 800 in a further embodiment of the present invention. The integrated circuit packaging system 800 is shown having a substrate 802 such as a laminated plastic or ceramic substrate.

Mounted above the substrate 802 is a through-silicon-via-die 806. The through-silicon-via-die 806 has a face side 808 and a back side 810 on a silicon substrate 812. The through-silicon-via-die 806 is mounted so that the face side 808 is facing the substrate 802.

Near the face side 808 is a circuitry layer 814. Partial vias 816 are etched or drilled across and through the circuitry layer 814 on the face side 808. The partial vias 816 are also etched through contact pads 818 on the face side 808.

The partial vias 816 are filled with metal plugs 820 and lined with via-insulation-layers 822. The metal plugs 820 fill the partial vias 816 and create overhangs 824 around the partial vias 816. The metal plugs 820 extend downward from the overhangs 824 and end with planar surfaces 826. Surrounding the metal plugs 820, while leaving the planar surfaces 826 exposed, is a face-side-dielectric-layer 828 with a planar surface 830.

The planar surface 830 of the face-side-dielectric-layer 828 is co-planar to the planar surfaces 826 of the metal plugs 820. On the back side 810 recesses 832 are formed into the silicon substrate 812. The recesses 832 exposes bottom surfaces 834 of the metal plugs 820. The recesses 832 are angled outward to provide a larger area near the back side 810 of the silicon substrate 812 than the metal plugs 820.

It has been discovered that the angle of the recesses 832 increases the through-silicon-via-die's strength because more of the silicon substrate 812 is preserved. The recesses 832 and the back side 810 are coated with a recess-insulation-layer 836 such as silicon dioxide or silicon nitride.

The through-silicon-via-die 806 is connected to the substrate 802 with interconnects such as solder balls 840. The solder balls 840 contact the metal plugs 820. Mounted above the through-silicon-via-die 806 is an integrated circuit structure such as a wire-bonded die 842 with an active side 844.

The active side 844 of the wire-bonded die 842 is connected to the through-silicon-via-die 806 with interconnects such as bond wires 846. The bond wires 846 connecting the wire-bonded die 842 to the through-silicon-via-die 806 connect to bottom surface 834 of the metal plugs 820.

An encapsulation 848 encapsulates the through-silicon-via-die 806, and the wire-bonded die 842. The encapsulation 848 protects sensitive components from moisture, dust and other contamination.

Figure 9:
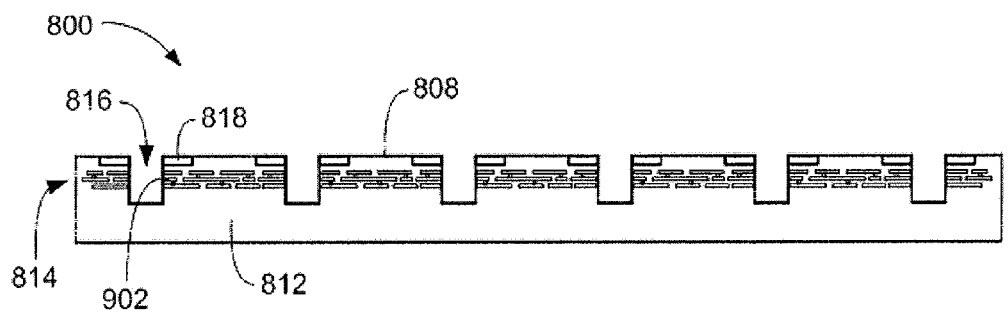
FIG. 9 is the integrated circuit packaging system of FIG. 8 after a via forming phase of manufacture.

Referring now to FIG. 9, therein is shown the integrated circuit packaging system 800 of FIG. 8 after a via forming phase of manufacture. The integrated circuit packaging system 800 is shown having the partial vias 816 are etched or drilled across and through the circuitry 902 of the circuitry layer 814 on the face side 808. The partial vias 816 are also etched through contact pads 818 on the face side 808. However, the partial vias 816 are only formed partially thorough the silicon substrate 812.

Figure 10:
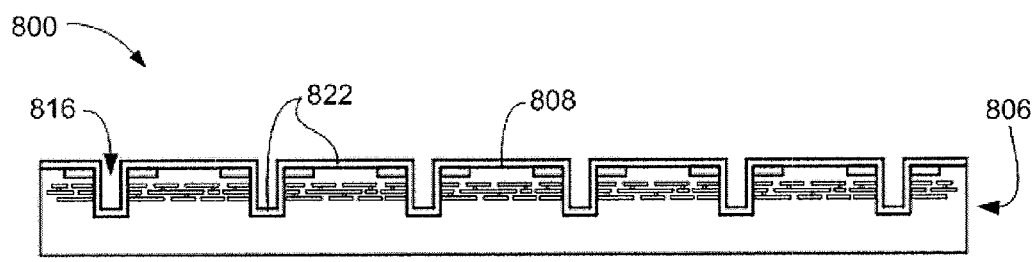
FIG. 10 is the integrated circuit packaging system of FIG. 8 after a via-insulation-layer deposition phase of manufacture.

Referring now to FIG. 10, therein is shown the integrated circuit packaging system 800 of FIG. 8 after an insulation and via-insulation-layer deposition phase of manufacture. The integrated circuit packaging system 800 is shown having the partial vias 816 are lined with via-insulation-layers 822 which also lines the face side 808 of the through-silicon-via-die 806.

Figure 11:
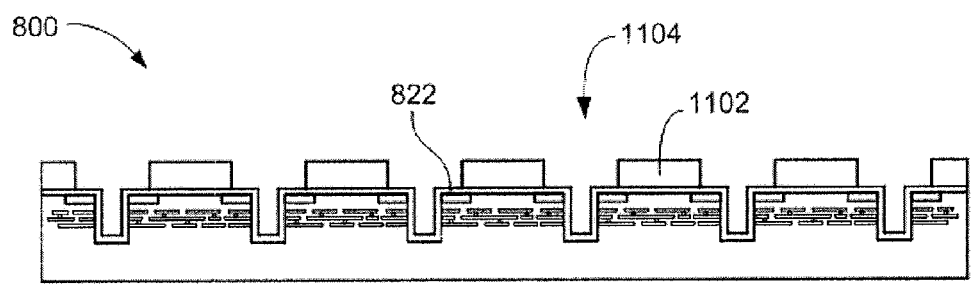
FIG. 11 is the integrated circuit packaging system of FIG. 8 after a photolithography phase of manufacture.

Referring now to FIG. 11, therein is shown the integrated circuit packaging system 800 of FIG. 8 after a photolithography phase of manufacture. The integrated circuit packaging system 800 is shown having a photo resist layer 1102 with a pattern 1104 deposited on the via-insulation-layers 822.

Figure 12:
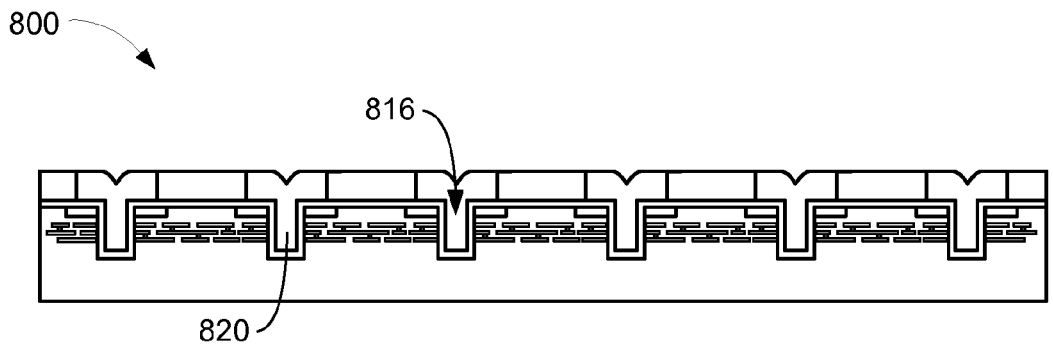
FIG. 12 is the integrated circuit packaging system of FIG. 8 after an electrolytic plating phase of manufacture.

Referring now to FIG. 12, therein is shown the integrated circuit packaging system 800 of FIG. 8 after an electrolytic plating phase of manufacture. The integrated circuit packaging system 800 is shown having the metal plugs 820 deposited in the partial vias 816.

Figure 13:
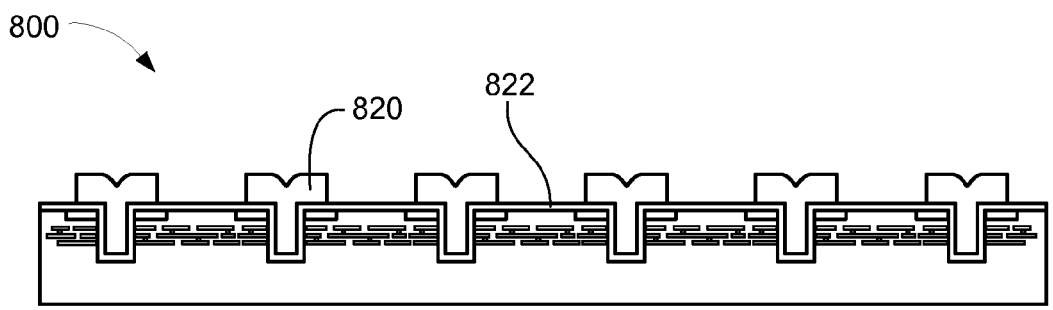
FIG. 13 is the integrated circuit packaging system of FIG. 8 after a photoresist strip phase of manufacture.

Referring now to FIG. 13, therein is shown the integrated circuit packaging system 800 of FIG. 8 after a photoresist strip phase of manufacture. The integrated circuit packaging system 800 is shown having the via-insulation-layers 822 and the metal plugs 820 exposed.

Figure 14:
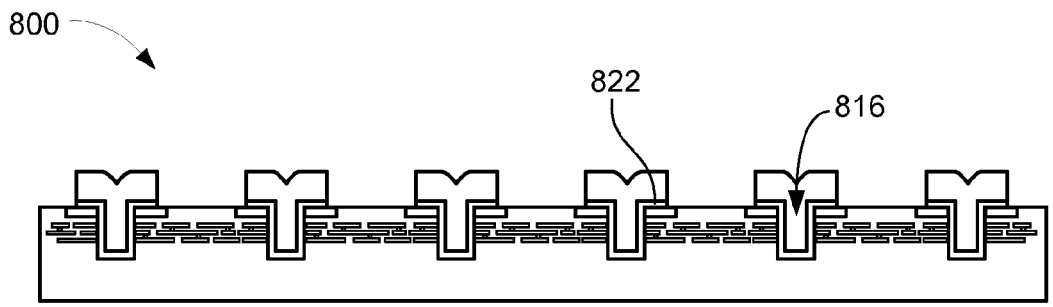
FIG. 14 is the integrated circuit packaging system of FIG. 8 after an etch phase of manufacture.

Referring now to FIG. 14, therein is shown the integrated circuit packaging system 800 of FIG. 8 after an etch phase of manufacture. The integrated circuit packaging system 800 is shown having the via-insulation-layers 822 etched so that the via-insulation-layers 822 are isolated to the partial vias 816.

Figure 15:
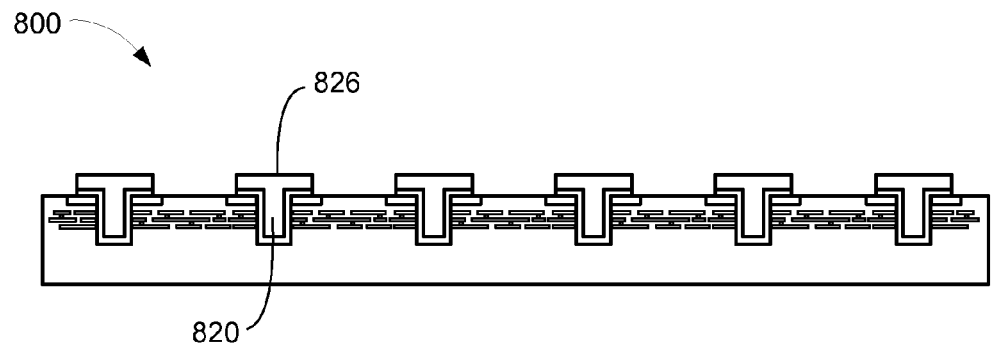
FIG. 15 is the integrated circuit packaging system of FIG. 8 after a planarizing phase of manufacture.

Referring now to FIG. 15, therein is shown the integrated circuit packaging system 800 of FIG. 8 after a planarizing phase of manufacture. The integrated circuit packaging system 800 is shown having the planar surfaces 826 created on the metal plugs 820.

Figure 16:
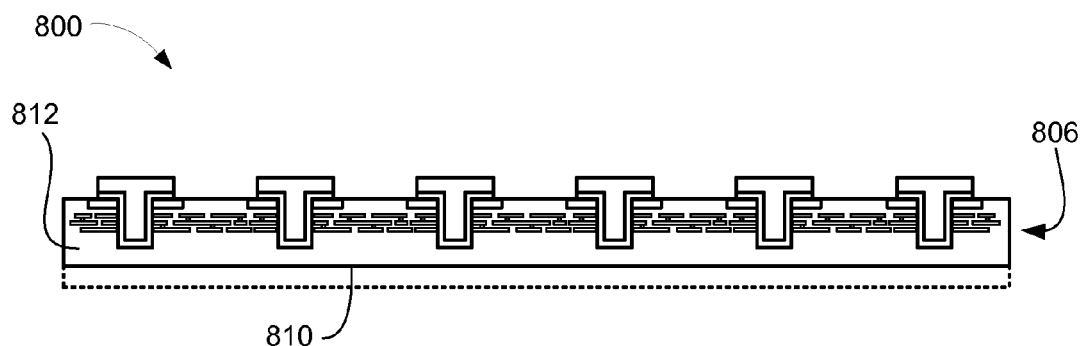
FIG. 16 is the integrated circuit packaging system of FIG. 8 after a backgrind phase of manufacture.

Referring now to FIG. 16, therein is shown the integrated circuit packaging system 800 of FIG. 8 after a backgrind phase of manufacture. The integrated circuit packaging system 800 is shown having the back side 810 of the through-silicon-via-die 806 ground down to create a silicon substrate 812 that is thinner.

Figure 17:
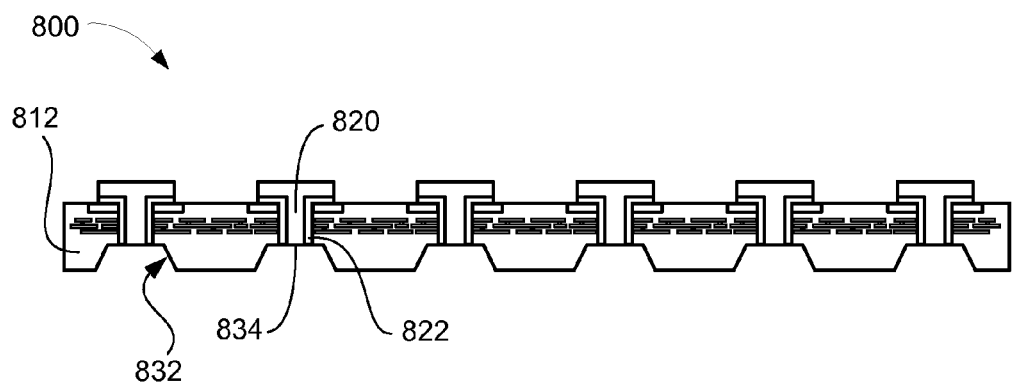
FIG. 17 is the integrated circuit packaging system of FIG. 8 after a recess forming phase of manufacture.

Referring now to FIG. 17, therein is shown the integrated circuit packaging system 800 of FIG. 8 after a recess forming phase of manufacture. The integrated circuit packaging system 800 is shown having the recesses 832 formed into the silicon substrate 812. The recesses 832 expose the bottom surfaces 834 of the metal plugs 820. The via-insulation-layers 822 are also etched through in order to expose the bottom surfaces 834 of the metal plugs 820.

Figure 18:
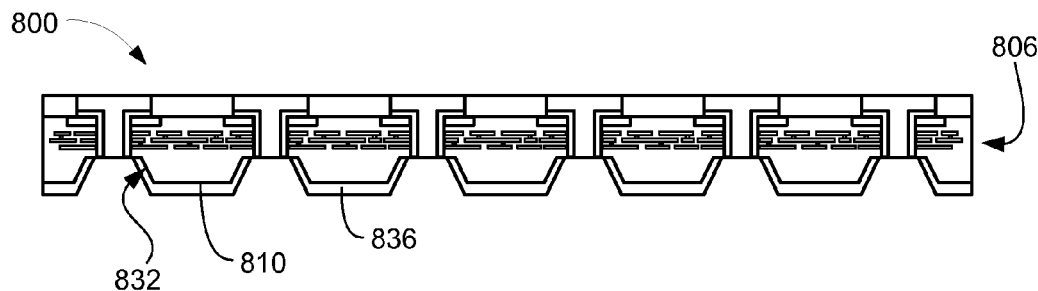
FIG. 18 is the integrated circuit packaging system of FIG. 8 after a recess dielectric deposition layer phase of manufacture.

Referring now to FIG. 18, therein is shown the integrated circuit packaging system 800 of FIG. 8 after a recess dielectric deposition layer phase of manufacture. The integrated circuit packaging system 800 is shown having the recesses 832 and the back side 810 of the through-silicon-via-die 806 coated with the recess-insulation-layer 836.

Figure 19:
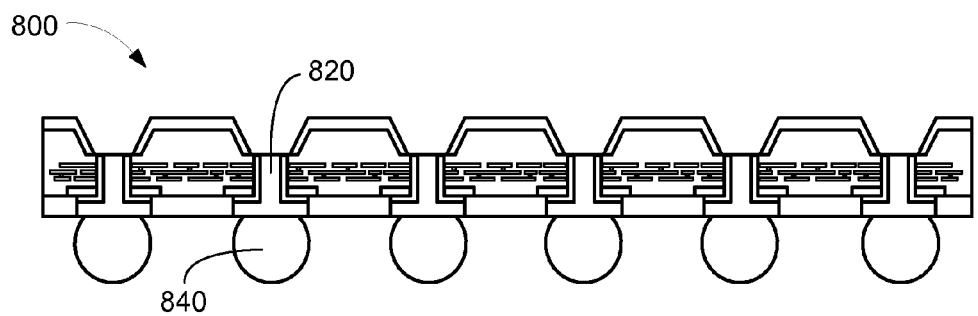
FIG. 19 is the integrated circuit packaging system of FIG. 8 after a solder ball forming phase of manufacture.

Referring now to FIG. 19, therein is shown the integrated circuit packaging system 800 of FIG. 8 after a solder ball forming phase of manufacture. The integrated circuit packaging system 800 is shown having the solder balls 840 formed on the metal plugs 820.

Figure 20:
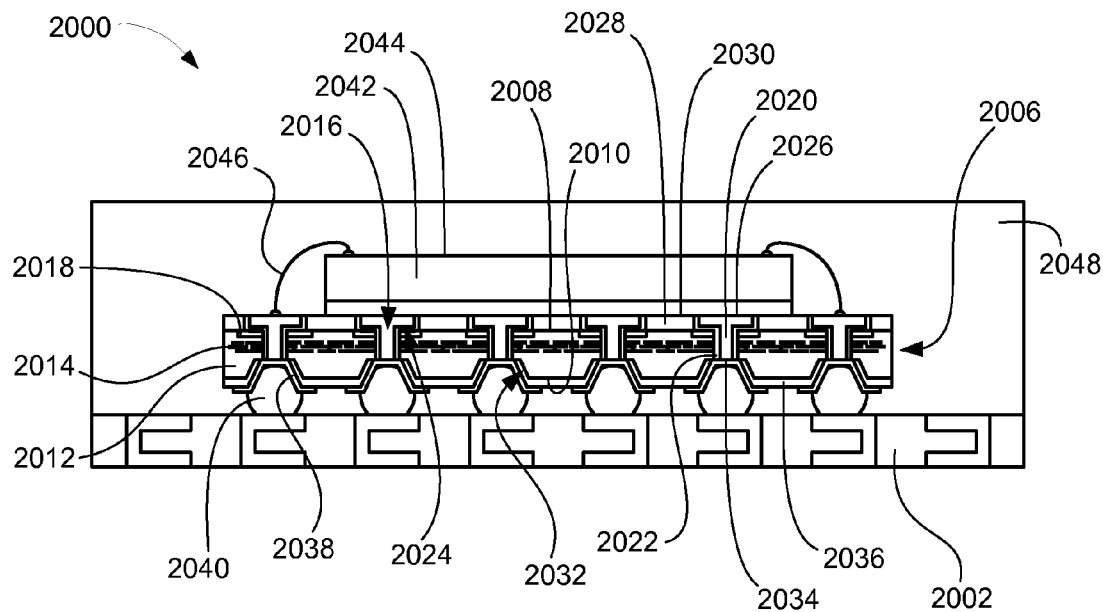
FIG. 20 is a cross-sectional view of an integrated circuit packaging system in a further embodiment of the present invention.

Referring now to FIG. 20, therein is shown a cross-sectional view of an integrated circuit packaging system 2000 in a further embodiment of the present invention. The integrated circuit packaging system 2000 is shown having a substrate 2002 such as a laminated plastic or ceramic substrate.

Mounted above the substrate 2002 is a through-silicon-via-die 2006. The through-silicon-via-die 2006 has a face side 2008 and a back side 2010 on a silicon substrate 2012. The through-silicon-via-die 2006 is mounted so that the back side 2010 is facing the substrate 2002.

Near the face side 2008 is a circuitry layer 2014. Partial vias 2016 are etched or drilled across and through the circuitry layer 2014 on the face side 2008. The partial vias 2016 are also etched through contact pads 2018 on the face side 2008.

The partial vias 2016 are filled with metal plugs 2020 and lined with via-insulation-layers 2022. The metal plugs 2020 fill the partial vias 2016 and create overhangs 2024 around the partial vias 2016. The metal plugs 2020 extend upward from the overhangs 2024 and end with planar surfaces 2026. Surrounding the metal plugs 2020, while leaving the planar surfaces 2026 exposed, is a face-side-dielectric-layer 2028 with a planar surface 2030.

The planar surface 2030 of the face-side-dielectric-layer 2028 is co-planar to the planar surfaces 2026 of the metal plugs 2020. On the back side 2010 recesses 2032 are formed into the silicon substrate 2012. The recesses 2032 exposes bottom surfaces 2034 of the metal plugs 2020. The recesses 2032 are angled outward to provide a larger area near the back side 2010 of the silicon substrate 2012 than the metal plugs 2020.

It has been discovered that the angle of the recesses 2032 increases the through-silicon-via-die's strength because more of the silicon substrate 2012 is preserved. The recesses 2032 and the back side 2010 are coated with a recess-insulation-layer 2036 such as silicon dioxide or silicon nitride. Plated inside the recesses 2032 are plated contacts 2038. The plated contacts 2038 contact the bottom surfaces 2034 of the metal plugs 2020.

The through-silicon-via-die 2006 is connected to the substrate 2002 with interconnects such as solder balls 2040. The solder balls 2040 contact the plated contacts 2038 in the recesses 2032 of the back side 2010. Mounted above the through-silicon-via-die 2006 is an integrated circuit structure such as a wire-bonded die 2042 with an active side 2044.

The active side 2044 of the wire-bonded die 2042 is connected to the through-silicon-via-die 2006 with interconnects such as bond wires 2046. An encapsulation 2048 encapsulates the through-silicon-via-die 2006, and the wire-bonded die 2042. The encapsulation 2048 protects sensitive components from moisture, dust and other contamination.

Figure 21:
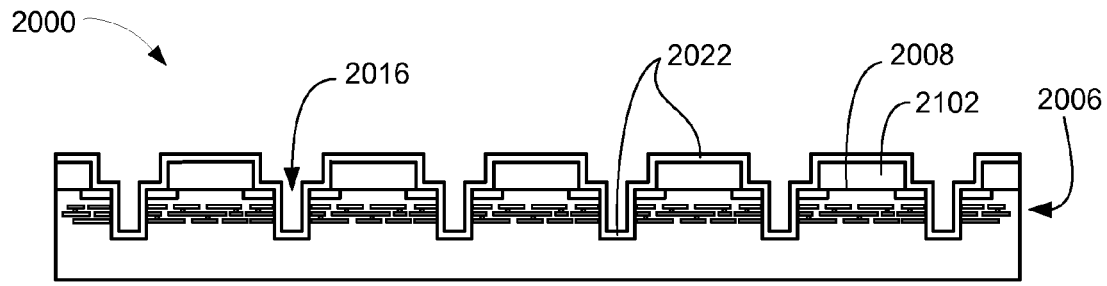
FIG. 21 is the integrated circuit packaging system of FIG. 20 after a via-insulation-layer deposition phase of manufacture.

Referring now to FIG. 21, therein is shown the integrated circuit packaging system 2000 of FIG. 20 after a via-insulation-layer deposition phase of manufacture. The integrated circuit packaging system 2000 is shown having the partial vias 2016 lined with via-insulation-layers 2022 which also lines a photoresist 2102 on the face side 2008 of the through-silicon-via-die 2006.

Figure 22:
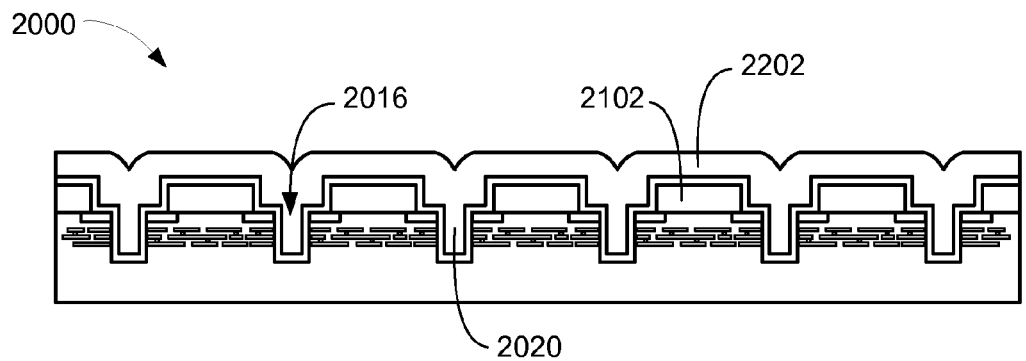
FIG. 22 is the integrated circuit packaging system of FIG. 20 after an electrolytic plating phase of manufacture.

Referring now to FIG. 22, therein is shown the integrated circuit packaging system 2000 of FIG. 20 after an electrolytic plating phase of manufacture. The integrated circuit packaging system 2000 is shown having the partial vias 2016 filled with the metal plugs 2020. Also metal 2202 is shown deposited above the photoresist 2102.

Figure 23:
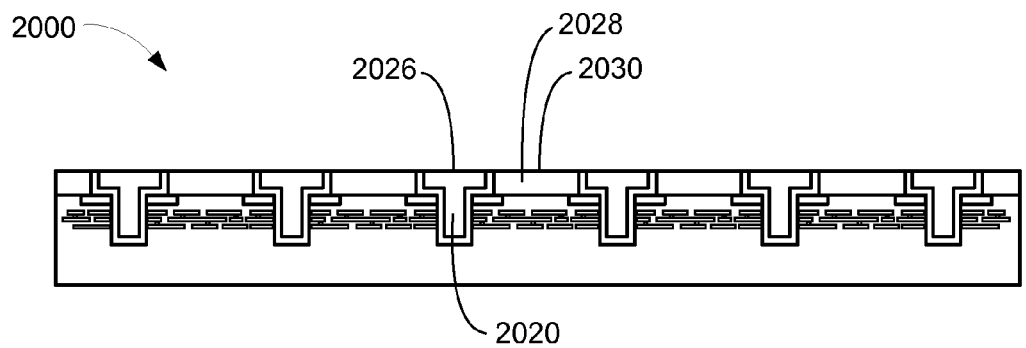
FIG. 23 is the integrated circuit packaging system of FIG. 20 after a planarizing phase of manufacture.

Referring now to FIG. 23, therein is shown the integrated circuit packaging system 2000 of FIG. 20 after a planarizing phase of manufacture. The integrated circuit packaging system 2000 is shown having the planar surfaces 2026 on the metal plugs 2020 and the planar surfaces 2030 on the face-side-dielectric-layer 2028.

Figure 24:
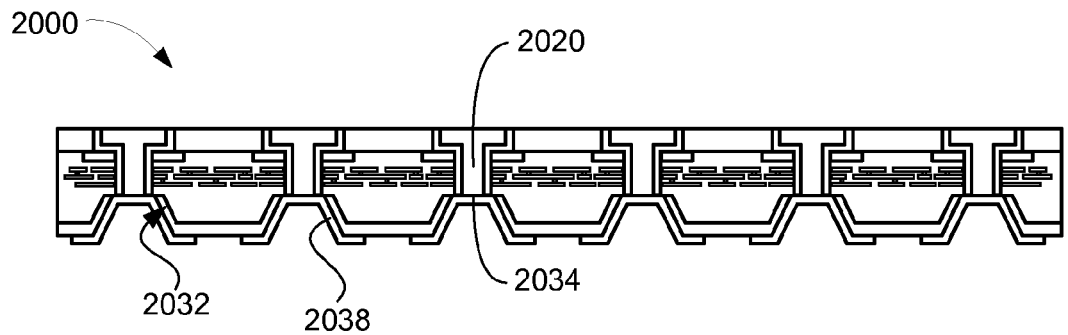
FIG. 24 is the integrated circuit packaging system of FIG. 20 after a recess conductive layer deposition phase of manufacture.

Referring now to FIG. 24, therein is shown the integrated circuit packaging system 2000 of FIG. 20 after a recess conductive layer deposition phase of manufacture. The integrated circuit packaging system 2000 is shown having the plated contacts 2038 plated inside the recesses 2032. The plated contacts 2038 contact the bottom surfaces 2034 of the metal plugs 2020.

Figure 25:
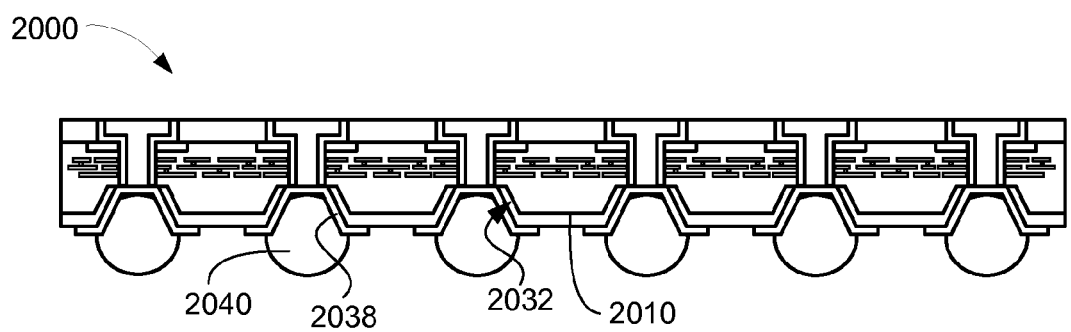
FIG. 25 is the integrated circuit packaging system of FIG. 20 after a solder ball forming phase of manufacture.

Referring now to FIG. 25, therein is shown the integrated circuit packaging system 2000 of FIG. 20 after a solder ball forming phase of manufacture. The integrated circuit packaging system 2000 is shown having the solder balls 2040 contact the plated contacts 2038 in the recesses 2032 of the back side 2010.

Figure 26:
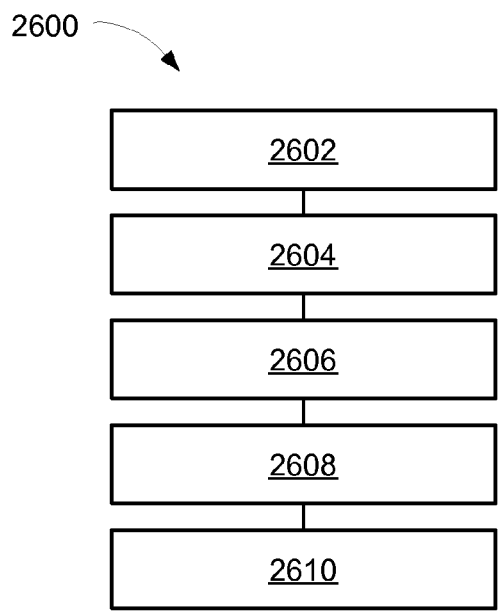
FIG. 26 is a flow chart of a method of manufacture of the integrated circuit packaging system of FIG. 1 in a further embodiment of the present invention.

Referring now to FIG. 26, therein is shown a flow chart of a method 2600 of manufacture of the integrated circuit packaging system 100 of FIG. 1 in a further embodiment of the present invention. The method 2600 includes providing a silicon substrate having a circuitry layer in a block 2602; creating a partial via through the circuitry layer in a block 2604; filling the partial via with a plug having a bottom surface in a block 2606; creating a recess that is angled outward and exposes the bottom surface of the plug in a block 2608; and coating the recess with a recess-insulation-layer while leaving the bottom surface of the plug exposed in a block 2610.

It has been discovered that the present invention thus has numerous aspects.

A principle aspect that has been unexpectedly discovered is that the present invention that the angle of the recesses increases the through-silicon-via-die's strength because more of the silicon substrate is preserved.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the through silicon vias with partial depth metal fill regions system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a silicon substrate having circuitry in a circuitry layer;
   creating a partial via through the circuitry in the circuitry layer;
   filling the partial via with a plug having a bottom surface;
   creating a recess that is angled outward and exposes the bottom surface of the plug; and
   coating the recess with a recess-insulation-layer while leaving the bottom surface of the plug exposed.

2. The method as claimed in claim 1 further comprising:
   lining the partial via with a via-insulation-layer; and
   wherein:
   creating the recess includes creating the recess through the via-insulation-layer.

3. The method as claimed in claim 1 further comprising:
   creating a plated contact inside the recess and the plated contact connects to the bottom surface of the plug.

4. The method as claimed in claim 1 further comprising:
   creating a planar surface on the plug; and
   creating a face-side-dielectric-layer surrounding the plug, while leaving the planar surface on the plug exposed.

5. The method as claimed in claim 1 wherein:
   providing the silicon substrate includes providing a contact pad; and
   creating the partial via includes creating the partial via through the contact pad.

6. A method of manufacture of an integrated circuit packaging system comprising:
   providing a silicon substrate having circuitry in a circuitry layer;
   creating a partial via through the circuitry in the circuitry layer;
   filling the partial via with a plug having a bottom surface;
   creating a recess that is angled outward and exposes the bottom surface of the plug;
   coating the recess with a recess-insulation-layer while leaving the bottom surface of the plug exposed to create a through-silicon-via-die;
   connecting the silicon substrate to a substrate; and
   encapsulating the silicon substrate with an encapsulation.

7. The method as claimed in claim 6 further comprising:
   mounting the silicon substrate over the substrate with the recess facing toward the substrate, mounting the silicon substrate over the substrate with the recess facing away from the substrate, mounting the silicon substrate in a substrate cavity, or a combination thereof.

8. The method as claimed in claim 6 further comprising:
   mounting a second-through-silicon-via-die above the first-through-silicon-via-die.

9. The method as claimed in claim 6 wherein:
   encapsulating includes partially encapsulating the through-silicon-via-die to expose the planar surface on the plug, the bottom surface of the plug, a plated contact created inside the recess, or a combination thereof.

10. The method as claimed in claim 6 further comprising:
    mounting an integrated circuit structure above the through-silicon-via-die; and
    connecting the integrated circuit structure to the through-silicon-via-die with an interconnect.

11. An integrated circuit packaging system comprising:
    a silicon substrate having circuitry in a circuitry layer;
    a partial via created through the circuitry in the circuitry layer;
    a plug having a bottom surface that fills the partial via;
    a recess that is angled outward and exposes the bottom surface of the plug; and
    a recess-insulation-layer that coats the recess while leaving the bottom surface of the plug exposed.

12. The system as claimed in claim 11 further comprising:
    a via-insulation-layer that lines the partial via; and
    wherein:
    the recess is created through the via-insulation-layer.

13. The system as claimed in claim 11 further comprising:
    a plated contact inside the recess and the plated contact connects to the bottom surface of the plug.

14. The system as claimed in claim 11 further comprising:
    creating a planar surface on the plug; and
    creating a face-side-dielectric-layer surrounding the plug, while leaving the planar surface on the plug exposed.

15. The system as claimed in claim 11 further comprising:
    a contact pad on the silicon substrate; and
    wherein:
    the partial via is created through the contact pad.

16. The system as claimed in claim 11 further comprising:
    a substrate connected to the silicon substrate; and
    an encapsulation that encapsulates the silicon substrate.

17. The system as claimed in claim 16 wherein:
    the silicon substrate is mounted over the substrate with the recess facing toward the substrate, the silicon substrate is mounted over the substrate with the recess facing away from the substrate, the silicon substrate is mounted in a substrate cavity, or a combination thereof.

18. The system as claimed in claim 16 further comprising:
    a second-through-silicon-via-die mounted above the first-through-silicon-via-die.

19. The system as claimed in claim 16 wherein:
    the encapsulation partially encapsulates the through-silicon-via-die to expose the planar surface on the plug, the bottom surface of the plug, a plated contact created inside the recess, or a combination thereof.

20. The system as claimed in claim 16 further comprising:
    an integrated circuit structure mounted above the through-silicon-via-die; and
    the integrated circuit structure connected to the through-silicon-via-die with an interconnect.

* * * * *